United States Patent [19]

Rosnowski

[11] 4,211,182
[45] Jul. 8, 1980

[54] DIFFUSION APPARATUS

[75] Inventor: Wojciech Rosnowski, Summit, N.J.

[73] Assignee: RCA Corporation, New York, N.Y.

[21] Appl. No.: 903,118

[22] Filed: May 5, 1978

[51] Int. Cl.² .............................................. C23C 13/08
[52] U.S. Cl. ..................................... 118/725; 156/611
[58] Field of Search ................... 118/48, 49.1, 49.5, 118/49, 715, 725; 148/174, 186, 175, 189; 156/611; 422/245; 427/250, 248 R

[56] References Cited

U.S. PATENT DOCUMENTS

| | | | |
|---|---|---|---|
| 2,341,603 | 2/1944 | Dorn et al. | 118/49 |
| 3,350,885 | 11/1967 | Hall et al. | 118/48 |
| 3,568,632 | 3/1971 | Cawthon | 118/49 |
| 3,577,287 | 5/1971 | Norwich et al. | 148/189 |
| 3,578,495 | 5/1971 | Pammer et al. | 118/49.5 |

Primary Examiner—Won H. Louie, Jr.
Attorney, Agent, or Firm—H. Christoffersen; D. S. Cohen; R. Ochis

[57] ABSTRACT

A diffusion apparatus, particularly useful for diffusing aluminum into semiconductor wafers, comprises a quartz evaporation tube in combination with a restrictor plate which is inserted in an open end thereof. The restrictor plate preferably has substantially the same shape as, but a slightly smaller cross-section than, the evaporation tube. In practice, the relatively small gap between the restrictor plate and the evaporation tube results in a substantially negligible leak in the diffusion apparatus. As a result the apparatus effectively operates as if it were a sealed ampule while in fact it is open, i.e. not sealed.

6 Claims, 1 Drawing Figure

U.S. Patent Jul. 8, 1980 4,211,182
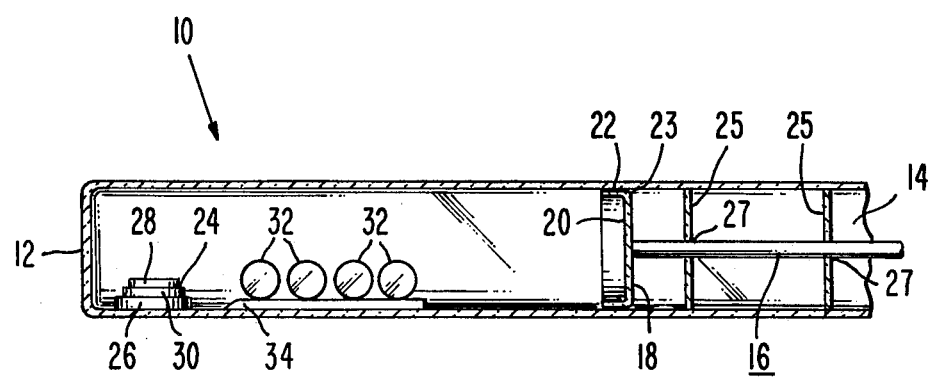

DIFFUSION APPARATUS

The present invention generally relates to diffusion systems and, in particular, relates to an evaporation apparatus for such a diffusion system.

Presently, most evaporation diffusion into semiconductor wafers is carried out in a sealed evacuated quartz tube. For relatively large wafers i.e., two inches or greater diameter, it is quite often necessary to back-fill such a tube with argon, or another inert element, to prevent the tube from collapsing under the high vacuum/high temperature diffusion conditions. The presence of such an inert gas decreases the partial pressure of the dopant vapor in the tube and results in a reduced surface concentration of the impurity on the semiconductor wafer surface.

In addition, such tubes, at the end of the diffusion process are usually physically shattered or otherwise broken to remove the wafers from inside. Thus, such quartz tubes cannot be reused and this increases the cost of the diffusion process in general which increases the cost of the final product.

It is desirable, therefore, to perform vapor diffusion without the need for back-filling and in such a fashion that the diffusion evaporation tube itself can be reused. An apparatus embodying the principles of the present invention accomplishes these objectives.

The single FIGURE of the drawing is a partial cross-sectional view of a novel diffusion apparatus, not drawn to scale, embodying the principles of the present invention.

The novel apparatus, embodying the principles of the present invention, comprises a hollow evaporation tube, indicated generally at 10 in the drawing, having a closed end 12 and an open end 14. Preferably the tube 10 is quartz and has an inside diameter on the order of about 7 cm. Although the quartz tube 10 can be any length desired it is usually on the order of about 100 cm long and has a wall thickness on the order of about 0.25 cm.

The apparatus further comprises a restrictor 16 which preferably comprises a plate 18 which has the same general cross-sectional shape as the tube 10 but, for reasons more fully explained below, has a slightly smaller cross-section. For example, if the tube 10 has a circular inside diameter on the order of about 7 cm, it is preferred that the plate 18 have a circular diameter on the order of about 6.7 cm. The restrictor 16 is fabricated from quartz although other similar materials may also be used. Preferably, the plate 18 has a face 20 which is positioned substantially perpendicular to the longitudinal axes of the tube 10. In addition, it is preferred that the plate 18 have a protruding rim 22 which extends from the peripheral edge 23 thereof toward the closed end 12 of the tube 10 a distance on the order of about 1.5 cm. The location of the restrictor 16 within the tube 10 is more fully discussed below.

While the following example describes the utilization of the novel apparatus for aluminum diffusion, it will be understood that dopants other than aluminum can also be utilized in such an apparatus. When aluminum is used as a dopant the quartz tube 10 should be substantially completely passivated prior to the actual diffusion process to eliminate any interaction between the aluminum vapor and the quartz tube 10. One method of accomplishing this is to position a source of aluminum (not shown) near the closed end 12 of the tube 10. The tube 10 is then connected to a vacuum system (not shown) without the restrictor 16 and raised to a temperature of about 1100° C. and maintained at that temperature for about two hours. During this time a vacuum of about $10^{-6}$ Torr is maintained within the tube 10. Under these conditions, aluminum molecules readily evaporate from the source since the aluminum partial pressure in the system is about three orders of magnitude higher than the pressure maintained by the vacuum system. The evaporated aluminum molecules react with the quartz of the tube 10 to produce a passivation layer thereon.

After the quartz tube 10 is passivated the dopant source 24 is then placed on a carrier 26, which may also be quartz, in the tube 10 near the closed end 12 thereof. In the case of aluminum diffusion the dopant source 24 can comprise for example, a block 28 of aluminum placed on a block 30 of silicon. A plurality of semiconductor wafers 32, into which the diffusion of aluminum atoms is to take place, are then placed on a carrier 34, also usually quartz, and positioned between the dopant source 24 and the open end 14 of the quartz tube 10. In the preferred embodiment the carriers 26 and 34 are passivated at the same time as the tube 10. The restrictor 16 is then moved into the tube 10 a preselected distance from the closed end 12 thereof, for example, a distance of about 55 cm from the closed end 12 of the tube 10. Preferably the restrictor 16 is positioned substantially coaxially with the longitudinal axis of the tube 10, so that the gap therebetween is substantially equal along the edge 23. One such technique for positioning the restrictor 16 is to insert a pair of cross-shaped centering units 25 having openings 27 therethrough in the tube 10. These units 25 contact the inside of this tube 10 at a plurality of points and the restrictor 16 protrudes through the openings 27. Thus the restrictor 16 is securely positioned within the tube 10. Other known bracing means can also be used to securely locate the restrictor 16 within the tube 10. The exact position of the plate 18 i.e. about 55 cm from the closed end 12, is determined by the effective length of the diffusion chamber desired. That is, the chamber must be longer for larger amount of wafers processed. Thereafter the tube 10 is closed but not sealed and heated, for example, by placing the tube 10 in a diffusion furnace (not shown) for a time long enough to carry out the desired dopant diffusion. For example, in order to achieve a wafer surface concentration on the order of about $10^{19}$ atoms/cm$^3$ the quartz tube 10 is placed in a furnace at a temperature of about 1175° C. for about one hour. At these temperatures, the gaseous flow of aluminum vapor during the diffusion time is regulated by the restrictor 16. For the conditions given above, the outflow i.e., the aluminum vapor which flows past the restrictor 16, is small enough to be negligible in comparison to the evaporation rate of the aluminum of the dopant source 24. As a result, such an apparatus, regardless of the fact that it is not sealed, effectively operates as if it were a sealed system. As such, the open end 14 of the tube 10 need not be fused and the quartz tube 10 can be utilized over and over again. Advantageously, since it is not necessary to back-fill the apparatus with an inert gas, since it is no longer necessary to subject the system to temperatures of about 1200° C. or greater for long periods of time which usually cause the tube to collapse, the partial pressure of the dopant is not reduced and higher surface concentrations are achievable.

What is claimed is:

1. A diffusion apparatus comprising:

a hollow diffusion tube having a length, a closed end and an open end, said tube including a diffusion chamber for containing (1) a source of dopant vapors and (2) semiconductor material into which said dopant is to be diffused;

carrier means positioned within said diffusion chamber for restrictor means positioned within said diffusion tube comprising a plate having substantially the same shape as the cross-section of said hollow portion of said diffusion tube, said cross-section taken perpendicular to the length of said diffusion tube, said plate being oriented perpendicular to said length of said tube means for positioning said restrictor means within said diffusion tube said restrictor means being located between said diffusion chamber and said open end of said diffusion tube for partially obstructing said diffusion tube to limit the escape of dopant vapors from said diffusion chamber through said open end of said diffusion tube in an amount which is small enough to be negligible in comparison to the generation rate of the dopant vapors generated by said source of dopant vapors.

2. A diffusion apparatus as claimed in claim 1 wherein said plate further comprises:

a peripheral edge having a rim extending therefrom toward said closed end.

3. A diffusion apparatus as claimed in claim 2 wherein:

said restrictor means is positioned within said tube such that said edge is substantially equidistant from said tube at all points therealong.

4. A diffusion apparatus as claimed in claim 1 wherein said diffusion tube has a circular cross-section.

5. A diffusion apparatus as claimed in claim 4 wherein:

said diffusion tube has an inside diameter on the order of about 7 cm; and said plate has a diameter on the order of about 6.7 cm.

6. The diffusion apparatus recited in claim 4 wherein the area of said restrictor plate is about 91.6% of the area of the hollow cross-section of said diffusion tube.

* * * * *

UNITED STATES PATENT AND TRADEMARK OFFICE
CERTIFICATE OF CORRECTION

PATENT NO. : 4,211,182

DATED : July 8, 1980

INVENTOR(S): Wojciech Rosnowski

It is certified that error appears in the above-identified patent and that said Letters Patent is hereby corrected as shown below:

Column 1, line 10:   replace "guite" with --quite--;

Column 3, line 7 :   after "for" add --supporting a semiconductor material;--;

Signed and Sealed this

Twenty-first Day of October 1980

[SEAL]

Attest:

SIDNEY A. DIAMOND

Attesting Officer

Commissioner of Patents and Trademarks